United States Patent [19]
Yokogawa et al.

[11] Patent Number: 5,274,248
[45] Date of Patent: Dec. 28, 1993

[54] LIGHT-EMITTING DEVICE WITH II-VI COMPOUNDS

[75] Inventors: Toshiya Yokogawa, Nara; Tadashi Narusawa; Minoru Kubo, both of Osaka, all of Japan

[73] Assignee: Matsushita Electric Industrial Co., Ltd., Osaka, Japan

[21] Appl. No.: 892,888

[22] Filed: Jun. 3, 1992

[30] Foreign Application Priority Data

Jun. 5, 1991 [JP] Japan .................. 3-133960
Sep. 5, 1991 [JP] Japan .................. 0225710

[51] Int. Cl.$^5$ ............................................. H01L 33/00
[52] U.S. Cl. ........................................ 257/22; 257/103; 257/96; 257/97; 257/94
[58] Field of Search .................. 257/94, 96, 97, 79, 257/103, 90, 13, 22

[56] References Cited

U.S. PATENT DOCUMENTS

| | | | |
|---|---|---|---|
| 4,868,615 | 9/1989 | Kamata | 257/103 X |
| 5,081,632 | 1/1992 | Migita et al. | 257/94 X |
| 5,103,269 | 4/1992 | Tomomura et al. | 257/94 X |
| 5,140,385 | 8/1992 | Kukimoto et al. | 257/94 |

FOREIGN PATENT DOCUMENTS

| | | | |
|---|---|---|---|
| 61-276384 | 12/1986 | Japan | 257/94 |
| 63-10577 | 1/1988 | Japan | 257/103 |
| 64-00777 | 1/1989 | Japan | 257/103 |

OTHER PUBLICATIONS

"P-type conduction in ZnSe grown by temperature difference method under controlled vapor pressure" by Jun-ichi Nishizawa et al; Journal of Applied Physics, vol. 59, No. 6; Mar. 15, 1986; pp. 2256-2258.

"Nitrogen-doped p-type ZnSe films grown by movpe" by Akira Ohki et al; Journal of Crystal Growth, vol. 93; 1988; pp., 692-696.

"Metalorganic vapor phase epitaxy of low-resistivity p-type ZnSe" by T. Yasuda et al; Applied Physics Letters, vol. 52, No. 1; Jan. 4, 1988; pp. 57-59.

Primary Examiner—William Mintel
Attorney, Agent, or Firm—Lowe, Price, LeBlanc & Becker

[57] ABSTRACT

The present invention provides a p-n junction type blue luminescence device forming a p-type hole injection layer and having high light-emission efficiency. On an n-conduction type ZnS substrate 111, there is formed a multiquantum well structure 112 alternately laminating a p-type ZnTe layer 112a and a non-doped ZnS layer 112b. And, a positive electrode 113 and a negative electrode 114 are provided on the multiquantum well structure 112 and the ZnS crystal, respectively. By applying forward bias voltage on this light-emitting device, electrons are injected from the n-type ZnS substrate to the multiquantum well structure 112. Then, these electrons are recombined with holes in the multiquantum well structure 112, so as to emit blue luminescence light. Thus, it becomes possible to easily and reproducibly obtain a p-conduction type hole injection layer so as to realize highly concentrated carrier injection and obtain high efficiency in emitting blue luminescence light.

8 Claims, 14 Drawing Sheets

- 54 Au ELECTRODE
- 53 2ND Sb DOPED ZnTe/ZnS MULTIQUANTUM WELL LAYER
- 52 1ST ZnTe/ZnS MULTIQUANTUM WELL LAYER
- 51 I DOPED n-TYPE ZnS SUBSTRATE
- 55 In ELECTRODE

P-TYPE ZnTe
53a
53b ZnS
ZnTe
52a
52b ZnS

LIGHT-EMITTING DEVICE WITH II-VI COMPOUNDS

BACKGROUND OF THE INVENTION

1. Field of the Invention

The present invention relates to a II-VI group compound semiconductor light-emitting device, used chiefly for a display apparatus, and further relates to its manufacturing method.

2. Description of the Prior Art

Recently, there has been developed a display light source of, for example, a wall type TV, comprising a blue luminescence color light-emitting diode (hereinafter, referred to as an LED). These light sources are expected to have good brightness and efficiency is expected. ZnSe and ZnS or ZnSSe of the II-VI group compound semiconductor have band gaps of 2.7 to 3.7 eV at room temperature, and their band structures are categorized into a direct transition type. Therefore, these II-VI group compound semiconductors are expected to be used as blue luminescence color LED semiconductor materials.

In general, in order to realize a blue luminescence color LED having high brightness and high efficiency, it is necessary to dope impurities into these materials to carry out the conduction type control so that a P-N junction structure can be accomplished. However, it is also known that it is difficult to obtain a low-resistivity p-type conduction from these ZnSe, ZnS or their mixed crystal ZnSSe.

Therefore, in order to obtain a low resistivity p-type conduction, numerous trials have been carried out in seeking a new acceptor impurity. An already reported result is that a p-type conduction can be realized by doping N or Li in ZnSe as disclosed in the Journal of Applied Physics 59 (1986) 2256, reported by J. Nishizawa, and also in the Journal of Crystal Growth 93 (1988) 692, reported by A. Ohki et al., or the Applied Physics Letters 52 (1988) 57, reported by Y. Yasuda et al.

FIG. 16 shows a construction of a p-n junction type blue luminescence color LED obtained by doping N impurities in ZnSe, as a conventional II-VI group compound semiconductor light-emitting device. A reference numeral 201 denotes a Si doped n-type GaAs substrate, and a reference numeral 202 denotes an Cl doped n-type ZnSe epitaxial layer. A reference numeral 203 denotes a N doped p-type ZnSe epitaxial layer. Reference numerals 204 and 205 denote Au and AuSn electrodes, respectively.

If a forward bias voltage is applied to this p-n junction structure, electrons as minority carriers are injected from the n-type ZnSe epitaxial layer 202 to the p-type ZnSe epitaxial layer 203 so as to obtain light-emission.

To the contrary, there was no report of the realization of low resistivity p-type conduction based on the doping of these impurities in the light-emitting device when adopting ZnS as the II-VI group compound semiconductor. That is, a p-n junction type blue luminescence color LED has not yet been obtained.

On the other hand, a ZnSe light-emitting device used as a conventional II-IV group compound semiconductor has the following problems.

Even if N or Li is doped as an impurity into the conventional ZnSe light-emitting device, it is not possible to obtain a practically sufficient hole concentration more than a carrier concentration $p \sim 10^{16}$ cm$^{-3}$. And, in the case where highly concentrated impurities of N or Li are forcibly doped into the ZnSe, red luminescence is chiefly generated from the deep acceptor level formed in the band gap as shown in FIG. 17. Namely, there was a problem in that a blue luminescent color could not be obtained in the conventional ZnSe light-emitting device.

Furthermore, a structure of the conventional ZnSe light-emitting device is a homo junction/hetero structure consisting of a p-n junction of a p-type ZnSe layer and an n-type ZnSe layer. That is, the structure of the conventional ZnSe light-emitting device is not a double hetero structure laminating more than three layers of semiconductor layers, each having different band gap energy. Therefore, it is not possible to confine highly concentrated electrons and photons in an active region causing light-emissions. Also, there were other problems in that light-emission efficiency could not be improved and stimulated emission (i.e. laser oscillation) could not be obtained in the conventional structure.

Moreover, in a light-emitting device adopting ZnS as II-VI group compound semiconductor, a low resistant p-type conduction cannot be obtained even if impurities are doped. Consequently, the realization of blue luminescence color is difficult in the conventional light-emitting device.

SUMMARY OF THE INVENTION

The present invention has a purpose, in view of the above problems and disadvantages encountered in the conventional art, to provide a light-emitting device emitting blue luminescence color with high brightness and high light-emission efficiency which is capable of injecting highly concentrated carriers and obtaining highly efficient blue luminescence color.

To accomplish this end, a first aspect of the present invention provides a light-emitting device comprising: an n-conduction type ZnS crystal; a structure alternately laminating a p-conduction type ZnTe layer or a p-conduction type ZnSTe layer and a ZnS layer on said n-conduction type ZnS crystal; a positive electrode provided on said structure; and a negative electrode provided on said ZnS crystal.

Further, a second aspect of the present invention provides a light-emitting device comprising: a GaAs substrate; an n-conduction type ZnS crystal provided on said GaAs substrate; a structure alternately laminating a p-conduction type ZnTe layer or a p-conduction type ZnSTe layer and a ZnS layer on said n-conduction type ZnS crystal; a positive electrode provided on said structure; and a negative electrode provided on said ZnS crystal.

Furthermore, a third aspect of the present invention provides a manufacturing method for a light-emitting device comprising the steps of: forming a structure alternately laminating a p-conduction type ZnTe layer or a p-conduction type ZnSTe layer and a ZnS layer on an n-conduction type ZnS crystal by use of MOCVD method; and forming a positive electrode on said structure, alternately laminating the ZnTe layer or the ZnSTe layer and the ZnS layer and a negative electrode on said ZnS crystal.

Moreover, a fourth aspect of the present invention provides a manufacturing method for a light-emitting device comprising the steps of: forming an n-conduction type ZnS crystal on a GaAs substrate by use of MOCVD method; forming a structure alternately laminating a p-conduction type ZnTe layer or a p-conduction type ZnSTe layer and a ZnS layer on the n-conduction type ZnS crystal by use of the MOCVD method; and forming a positive electrode on said structure alternately laminating the ZnTe layer or the ZnSTe layer and the ZnS layer and a negative electrode on said ZnS crystal.

Yet further, a fifth aspect of the present invention provides a light-emitting device comprising: an n-conduction type ZnS crystal; a first structure alternately laminating a ZnTe layer or a ZnSTe layer and a ZnS layer on said n-conduction type ZnS crystal; a second structure alternately laminating a p-conduction type ZnTe layer or a p-conduction type ZnSTe layer and a ZnS layer on said first structure; a positive electrode provided on said second structure; and a negative electrode provided on said ZnS crystal.

Still further, a sixth aspect of the present invention provides a light-emitting device comprising: a GaAs substrate; an n-conduction type ZnS crystal provided on said GaAs substrate; a first structure alternately laminating a ZnTe layer or a ZnSTe layer and a ZnS layer on said n-conduction type ZnS crystal; a second structure alternately laminating a p-conduction type ZnTe layer or a p-conduction type ZnSTe layer and a ZnS layer on said first structure; a positive electrode provided on said second structure; and a negative electrode provided on said ZnS crystal.

Moreover, a seventh aspect of the present invention provides a manufacturing method for a light-emitting device comprising the steps of: forming a first structure alternately laminating a ZnTe layer or a ZnSTe layer and a ZnS layer on an n-conduction type ZnS crystal by use of MOCVD method; forming a second structure alternately laminating a p-conduction type ZnTe layer or a p-conduction type ZnSTe layer and a ZnS layer on said first structure by use of MOCVD method; and forming a positive electrode on said second structure alternately laminating the ZnTe layer or the ZnSTe layer and the ZnS layer and a negative electrode on said ZnS crystal.

Furthermore, an eighth aspect of the present invention provides a manufacturing method for a light-emitting device comprising the steps of: forming an n-conduction type ZnS crystal on a GaAs substrate by use of MOCVD method; forming a first structure alternately laminating a ZnTe layer or a ZnSTe layer and a ZnS layer on the n-conduction type ZnS crystal by use of the MOCVD method; forming a second structure alternately laminating a p-conduction type ZnTe layer or a p-conduction type ZnSTe layer and a ZnS layer on said first structure by use of the MOCVD method; and forming a positive electrode on said second structure alternately laminating the ZnTe layer or the ZnSTe layer and the ZnS layer and a negative electrode on said ZnS crystal.

With these arrangements, the present invention effects the following functions.

(1) In the case where a light-emitting device includes ZnS or ZnSe as a II-VI group compound semiconductor, a practically sufficient hole concentration more than carrier concentration $p \sim 10^{16}$ cm$^{-3}$ cannot be obtained even if accepter impurities are added into ZnS crystal or ZnSe crystal.

On the contrary, in case of ZnTe crystal or ZnSTe crystal in accordance with the present invention, a sufficient hole concentration ($p \sim 10^{18}$ cm$^{-3}$) can be obtained by doping accepter impurities.

Furthermore, p-type ZnTe crystal and p-type ZnSTe crystal have respectively a band gap of 2.26 eV. This band gap cannot cause blue luminescence color, though it is possible to obtain green luminescence color.

Therefore, as shown in the construction of the present invention, there is provided a multiquantum well structure alternately laminating a p-type ZnTe layer and a non-doped ZnS or a multiquantum well structure alternately laminating a p-type ZnSTe layer and a non-doped ZnS.

By constucting a p-type layer into such a multiquantum well structure and controlling film thicknesses of the p-type ZnTe layer and the non-doped ZnS layer to be predetermined values, it becomes possible to set the effective band gap of the p-type multiquantum well layer to a desired value within a range equivalent to a wavelength range from 550 nm of ZnTe to 340 nm of Zns.

In the same way, by constructing the multiquantum well structure consisting of the p-type ZnSTe mixed crystal layer and the non-doped ZnS layer as a p-type layer and controlling film thicknesses of the p-type ZnSTe layer and the non-doped ZnS layer to be predetermined values, it becomes possible to set the effective band gap of the p-type multiquantum well layer to a desired value within a range equivalent to a wavelength range from 550 nm of ZnSTe to 340 nm of ZnS.

Accordingly, the present invention provides a p-type layer having practically sufficient hole concentration and wide band gap capable of emitting blue luminescence color.

(2) In the multiquantum well structure alternately laminating the p-type ZnTe layer and the non-doped ZnS layer or the multiquantum well structure alternately laminating the p-type ZnSTe layer and the non-doped ZnS layer, no deep accepter level exists in the ZnTe layer or the ZnSTe layer even if p-type impurities are doped in the ZnTe layer or the ZnSTe layer to have sufficient p-type carrier concentration.

That is, no luminescence color other than a blue luminescence color is generated. Accordingly, it is possible to obtain a blue luminescence color light-emitting device emitting strong blue luminescence light at room temperature.

(3) In the multiquantum well structure alternately laminating the ZnTe layer and the ZnS layer or the multiquantum well structure alternately laminating the ZnSTe layer and the ZnS layer, its density of state shows a stepwise distribution in such a manner that the density of state remarkably increases near the band gap energy. Therefore, it becomes possible to obtain high efficiency in emitting blue luminescence light at room temperature.

(4) By setting the effective band gap of the first multiquantum well structure to be smaller than that of the effective band gap of the second multiquantum well structure, a double hetero structure laminating three kinds of semiconductor layers having mutually different band gap energies is formed by the ZnS, and the first and the second multiquantum well structures.

Accordingly, it becomes possible to confine highly concentrated electrons and photons in the first multiquantum well structure of an active region so as to increase light-emission efficiency and realize the stimulated emission (i.e. laser oscillation).

The above and other objects, features and advantages of the present invention will become more apparent

DETAIL DESCRIPTION OF THE PREFERRED EMBODIMENTS

Hereinafter, referring now to the accompanying drawings, embodiments of the present invention are explained in detail.

FIRST EMBODIMENT

Figure 1A:
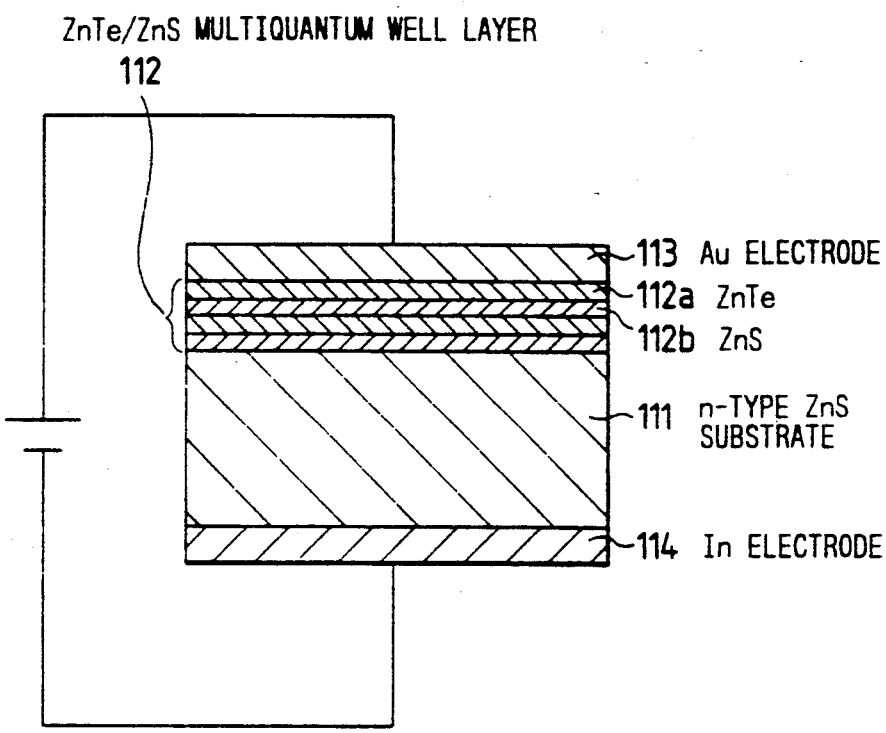
FIG. 1(a)-1(b) are cross-sectional views showing a structure of ZnS blue luminescence color LED in accordance with a first embodiment of the present invention, accompanying a band view.

First of all, a first embodiment of the present invention is explained. FIG. 1 (a) is a cross-sectional view showing a structure of a blue luminescene color light-emitting device (hereinafter, referred to as an LED) in accordance with the present invention. A reference numeral 111 denotes an I(indium) doped n-type ZnS substrate, and a reference numeral 112 denotes an Sb(antimony) doped ZnTe/ZnS multiquantum well layer. The doping concentration of I and Sb are respectively $1 \times 10^{18}$ cm$^{-3}$.

The ZnS substrate 111 is doped with I to be n-type ZnS having carrier concentration of $1 \times 10^{18}$ cm$^{-3}$ since ZnTe 112a is adopted as p-type ZnTe, it becomes possible to obtains a p-type having highly concentrated carrier concentration of $1 \times 10^{18}$ cm$^{-3}$ which could not obtained from the ZnSe or ZnS.

Reference numerals 113 and 114 denote an Au electrode as a p-type electrode and an In electrode as an n-type electrode, respectively.

If Sb is doped into the ZnTe layer 112a constituting ZnTe/ZnS multiquantum well layer 112, the ZnTe layer 112a becomes p-conduction type in which holes function as carriers. In this case, it is very convenient that ZnTe can be formed into a highly concentrated p-type compared with ZnS or ZnSe.

However, the band gap of ZnTe is equivalent to a wavelength of 550 nm calculated in terms of wavelength, therefore luminescence color becomes green.

Accordingly, in order to obtain a blue luminescence color LED, it becomes necessary to increase the band gap by an amount equivalent to a wavelength change from the present 550 nm to approximately 480 nm calculated in terms of wavelength.

ZnTe is used as a p-type layer since ZnTe can form a highly concentrated p-type. And, ZnS having a band gap equivalent to a wavelength of 340 nm is also used. The p-type ZnTe layer and the non-doped ZnS constitute a multiquantum well structure. With this arrangement, the band gap of p-type layer can be increased to that of blue luminescence color.

If carriers in the ZnTe/ZnS multiquantum well layer 112 are confined in the potential well formed by means of hetero junction, degree of freedom of these carriers become restricted. Consequently, a quantum level is formed in the ZnTe/ZnS multiquantum well layer 112.

Since the quantum level formed in the ZnTe/ZnS multiquantum well layer 112 varies based on a film thickness of the well layer, the effective band gap can be shortened within a range from approximately 550 nm to approximately 340 nm calculated in terms of wavelength by varying the film thicknesses of the ZnTe layer 112a and the ZnS layer 112b. In this embodiment, the film thicknesses of the ZnTe layer 112a and the ZnS layer 112b are respectively determined to be 1 nm. Their effective band gaps become 450 nm calculated in terms of wavelength.

The band gap of the multiquantum well structure consisting of the p-type ZnTe layer and the non-doped ZnS is calculated according to the following formulas.

$$\cos k_z(L_z + L_s) = \cosh(\gamma L_s)\cos(\xi L_z) +$$
$$\{(1 - \omega^2)/2\omega\}\sinh(\gamma L_s)\sin(\xi L_z)$$

[Formula 1]

wherein, $$\gamma = [2m_B^* \{\Delta E - E_z(k_z)\}/\hbar^2]^{\frac{1}{2}}$$ [Formula 2]

$$\xi = \{2m_z^* E_z(k_z)/\hbar^2\}^{\frac{1}{2}}$$ [Formula 3]

$$\omega = \xi/\gamma$$ [Formula 4]

A coefficient kz denotes a z-component of wave number vector, and mz* and mb* denote effective masses of electrons (holes) in the well layer and the barrier layer. And, ΔE denotes a band offset amount.

If calculated based on this formula 1, the band gap becomes 450 nm when the film thicknesses of ZnTe 112a and ZnS 112b are respectively 1 nm. Thus, it becomes possible to control the band gap within a blue luminescence color.

Furthermore, the ZnTe/ZnS multiquantum well layer 112 shows p-conduction type, and its average hole carrier concentration becomes $4 \times 10^{17}$ cm$^{-3}$. Accordingly, if the Au electrode 113 is applied a positive bias voltage and the In electrode 114 is applied a negative bias voltage in the present invention, it is found that electrons are injected from the n-type ZnS 111 to the Sb doped ZnTe/ZnS multiquantum well layer 112.

Figure 1B:
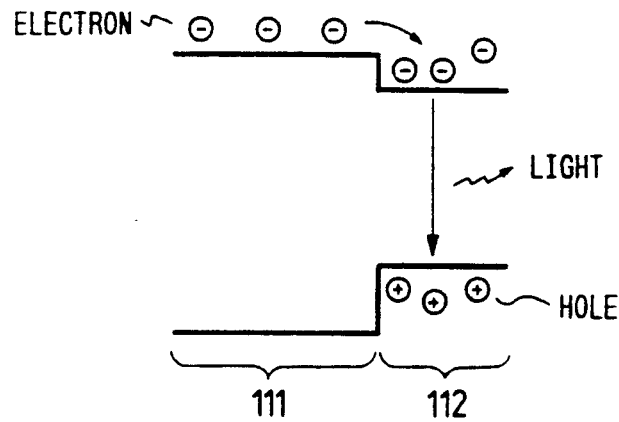

As a result, these electrons as minority carriers are recombined with majority carriers (holes) in the Sb doped ZnTe/ZnS multiquantum well layer 112 so as to generate blue luminescence light. FIG. 1(b) shows the light-emission mechanism together with the band structure of ZnS blue luminescence color LED.

Figure 2:
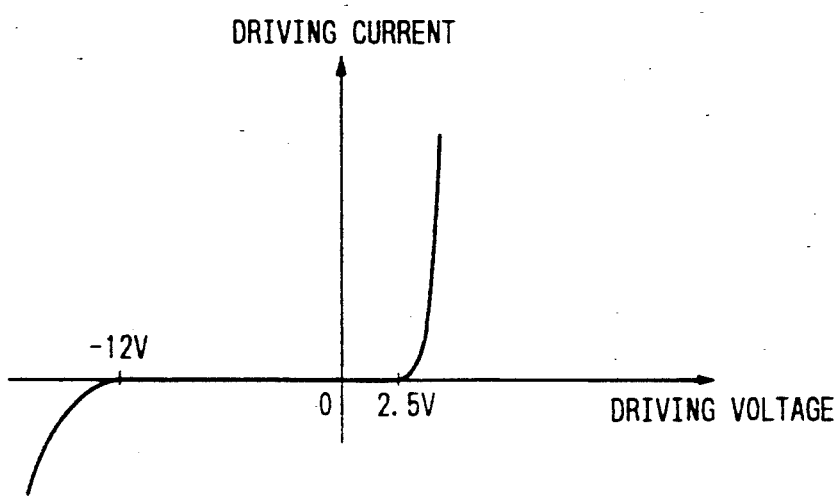
FIG. 2 is a graph showing current/voltage characteristics of the ZnS blue luminescence color LED in accordance with the first embodiment of the present invention.

FIG. 2 shows current-voltage characteristics of the LED in accordance with the present embodiment. An ordinate represents driving current of LED, and an abscissa represents driving voltage. As shown in the drawing, it is understood that the voltage-current characteristics shows adequate rectification characteristics indicating a formation of p-n junction structure. In this case, a turn-on voltage was approximately 2.5 V, and a reverse bias breakdown was 12 V.

A previously reported a p-n junction LED made of ZnSe has a very large turn-on voltage, since ZnSe LED has a large parasitic resistance. However, the LED shown in FIG. 1 showed a very low turn-on voltage and, thus, it is confirmed from this result that a p-n junction structure having a low parasitic resistance is surely formed.

Figure 3:
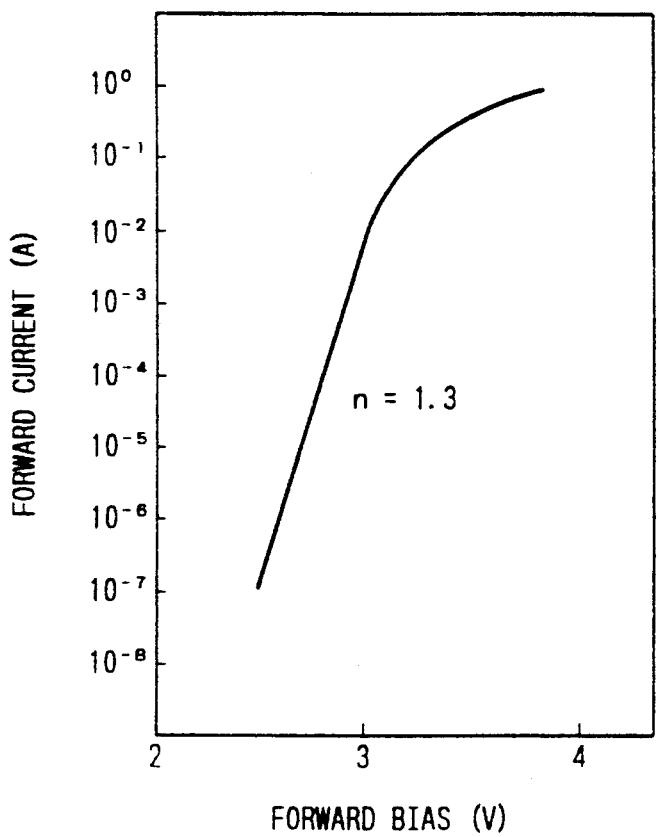
FIG. 3 is also a graph showing current/voltage characteristics of the ZnS blue luminescence color LED in accordance with the first embodiment of the present invention.

FIG. 3 also shows current-voltage characteristics of the LED in accordance with the present invention. An ordinate denotes forward current, and an abscissa denotes forward voltage. In accordance with this graph, if the forward voltage applied to the LED is increased, the forward current is correspondingly increased. This graph shows the characteristics of n=1.3.

Here, n value is an n defined in the following formula.

$$I = IO \cdot exp(eV/nkT)$$

I: driving current
IO: constant
e: prime electric charge
V: driving voltage
n: diode ideality factor
k: Boltzmann's constant
T: temperature This n value serves as a number expressing whether or not the p-n junction diode is in an ideal driving state. If the n value is equal to 1, that means an ideal relationship is established between the forward bias and the driving current in the p-n junction.

On the other hand, if carries are generated or extinguished in the transition region of the p-n junction due to trap in the band gap, this n value increases up to 2. The LED in accordance with the present invention has the n value of 1.3 until the forward current approaches to $10^{-3}$ A. Accordingly, it is understood that the LED in accordance with the present invention has adequate p-n junction characteristics. With the construction of this LED, a strong blue luminescence color having a wavelength of approximately 460 nm was obtained at room temperature.

Figure 4:
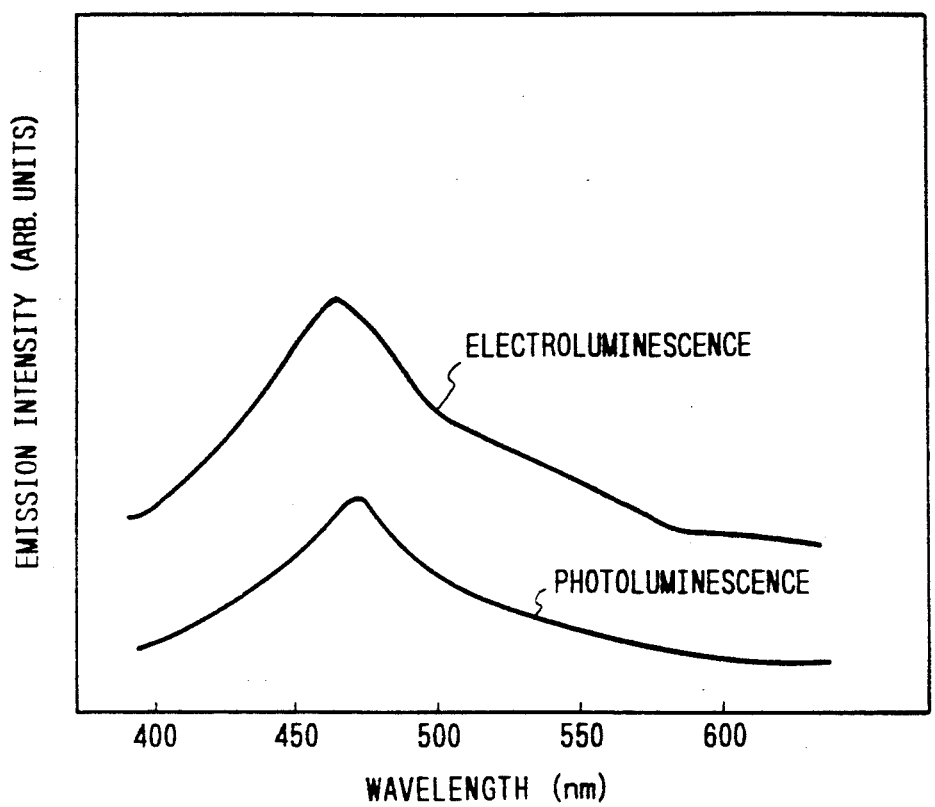
FIG. 4 shows electroluminescence spectrum of the ZnS blue luminescence color LED in accordance with the first embodiment of the present invention at room temperature and photoluminescence spectrum of the Sb doped ZnTe/ZnS multiquantum well layer at room temperature.

FIG. 4 shows electroluminescence (EL) spectrum for the LED in accordance with the present embodiment and photoluminescence spectrum for the Sb doped ZnTe/ZnS multiquantum well layer 112 at room temperature. A forward current of the diode is 4 V. The EL spectrum has a peak in the blue luminescence color region of 2.7 eV.

Since the EL spectrum of the LED and the PL spectrum of the Sb doped ZnTe/ZnS multiquantum well layer coincide with each other, it is considered that the EL light-emission of the LED is carried out by the recombination of holes as majority carriers in the Sb doped ZnTe/ZnS multiquantum well layer 112 and electrons as minority carriers. An external quantum efficiency was 1%.

Figure 5:
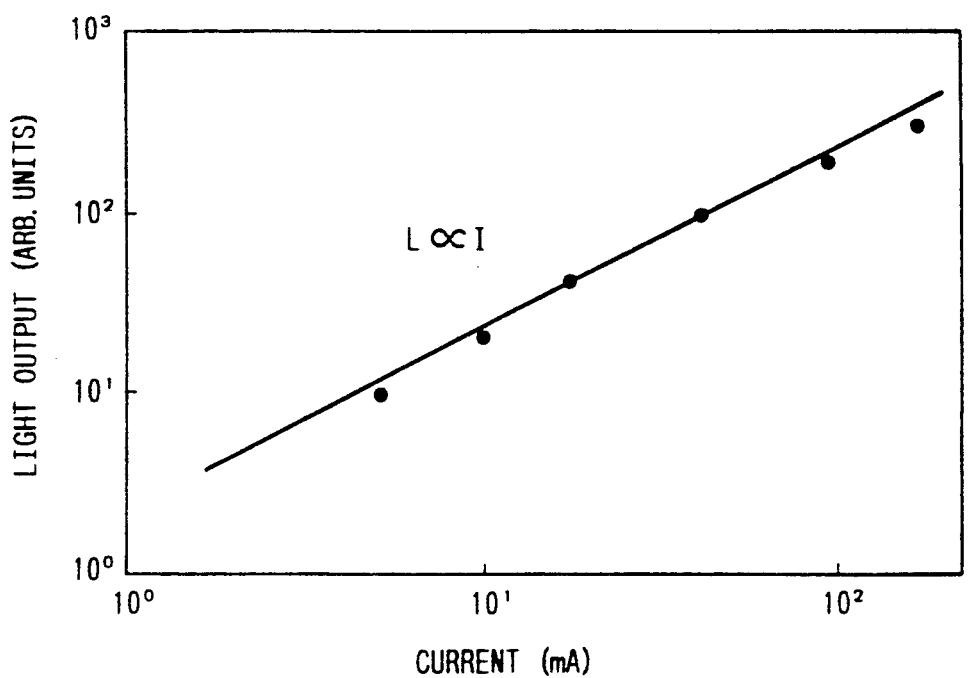
FIG. 5 is a graph showing the relationship between driving current of the ZnS blue luminescence color LED in accordance with the first embodiment of the present invention and blue luminescence light intensity.

FIG. 5 shows the total emission intensity of EL as a function of diode current. The emission power increases linearly with the current, which indicates that there are few non-radiative recombination centers in the p-n diodes.

SECOND EMBODIMENT

Next, one example of manufacturing method of the LED in accordance with the present invention is explained with reference to FIG. 6. This embodiment adopts an iodine transport method for a growth method of ZnS 111. First of all, the growth in compliance with the iodine transport method is explained.

After having been processed through three-hour deoxidation at temperature of 850° C. in highly purified hydrogen, the powder of ZnS is confined in a silica ampul etc. with vacuum of $2 \times 10^{-6}$. Torr and, in turn, sintered 50 hours at temperature of 1000° C. Thus sintered ZnS is used as the material. Furthermore, ZnS singlecrystal being mirror lapped and having (111) surface applied with chemical etching is adopted as species crystal.

Iodine of 5 mg/cm2 concentration is confined in the growth ampul together with the sintered ZnS and the species crystal ZnS so as to allow the growth. In the growth ampul, temperature of the sintered ZnS is set to 850° C. and temperature of the ZnS species crystal is set to 840° C., so that temperature gradient is maintained. The growth was continued approximately 10 days.

Figure 6A:
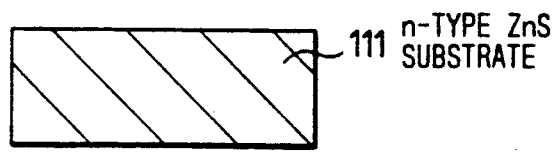
FIG. 6(a)-6(d) are cross-sectional views showing manufacturing steps of the ZnS blue luminescence color LED in accordance with a second embodiment of the present invention.
Figure 6B:
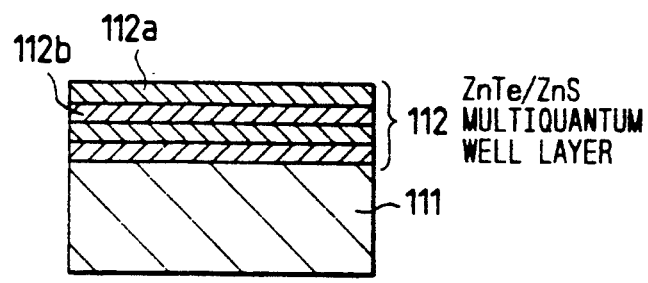

Next, the ZnTe/ZnS multiquantum well layer 112 is formed on the ZnS crystal 111 shown in FIG. 6(a) by use of a metal organic chemical vapor deposition (hereinafter, referred to as MOCVD) method, as shown in FIG. 6(b).

A ZnTe layer 112a constituting the ZnTe/ZnS multiquantum well layer 112 is made from dimethylzinc and dimethyltellurium, and a ZnS layer 112b is made from dimethylzinc and hydrogen sulfide. The dopant Sb is made from trimethylantimony.

Typical supply amounts of dimethylzinc, dimethyltellurium, hydrogen sulfide, and trimethylantimony are respectively $4 \times 10^{-5}$ mol/min, $5 \sim 100 \times 10^{-6}$ mol/min, $6 \sim 40 \times 10^{-6}$ mol/min, and $6 \sim 30 \times 10^{-6}$ mol/min, respectively. Temperature of the substrate is set to 350°~450° C., and growth pressure is set to 50 Torr.

Figure 6C:
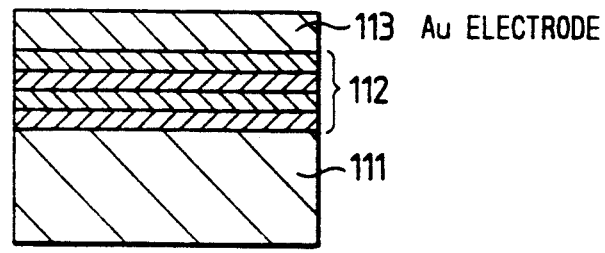
Figure 6D:
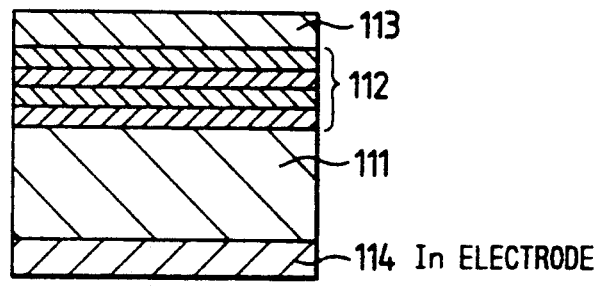

First of all, an oxide film on the surface of ZnS substrate 111 is removed by etchants of 50% NaOH aqueous solution. Next, as shown in FIG. 6(b), the Sb doped ZnTe layer 112a is grown up to 1 nm by use of dimethylzinc, dimethyltellurium and trimethylantimony and, in turn, the ZnS layer 112b is grown up to 1 nm by use of dimethylzinc and hydrogen sulfide. Then, by alternately changing material gases, an alternating 100-cycle growth is obtained. After that, as shown in FIGS. 6(c) and 6(d), electrodes 113 and 114 are formed by metallic deposition of Au and In.

Figure 7:
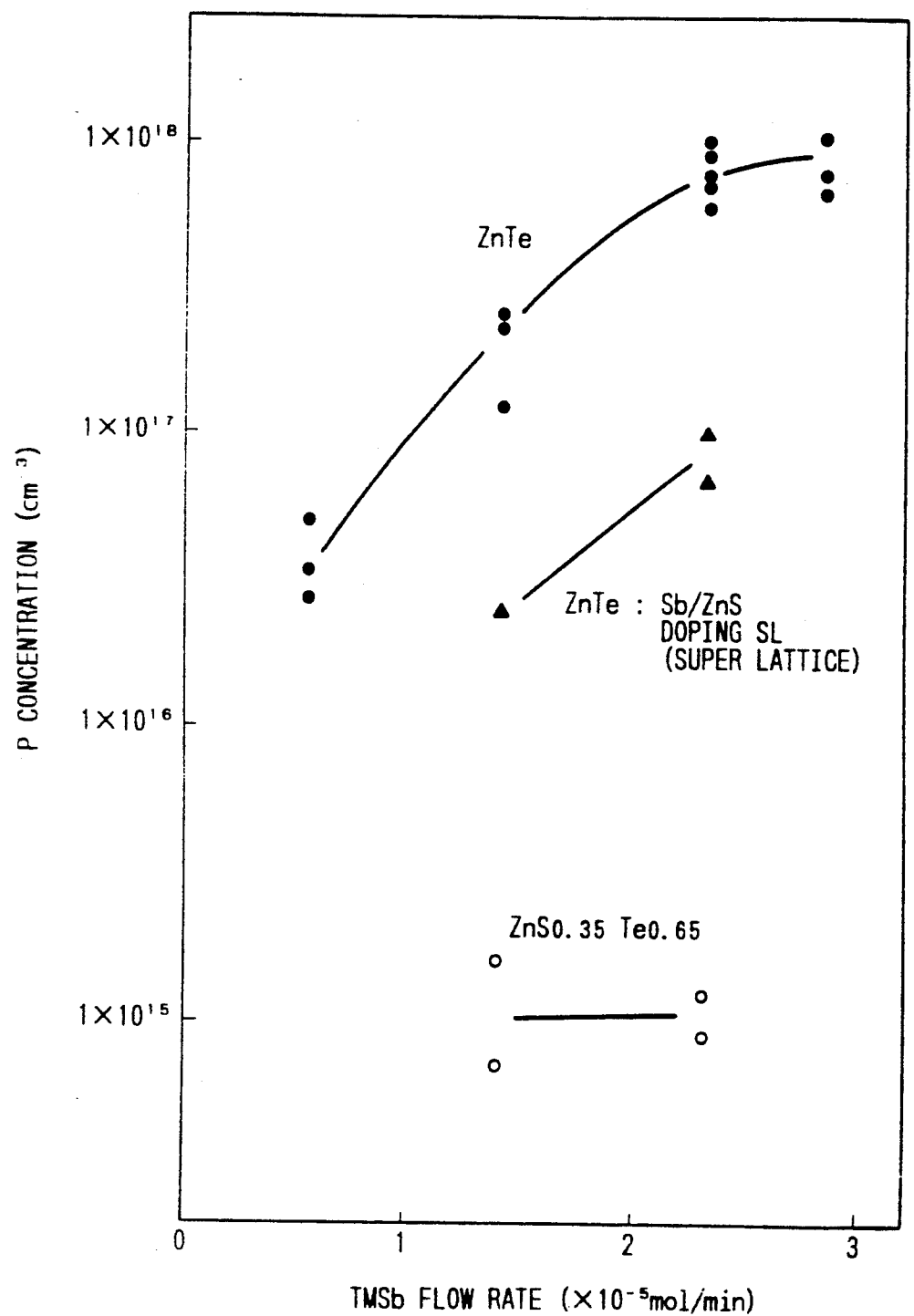
FIG. 7 shows change of hole carrier concentration with respect to supply amount of the trimethylantimony in the Sb doped ZnTe, ZnSTe, and ZnTe/ZnS multiquantum well layer.

FIG. 7 shows change of hole carrier concentration with respect to supply amount of the trimethylantimony. The carrier concentration in the ZnTe layer and the Sb doped ZnTe/ZnS multiquantum well structure monotonically increases with respect to the supply amount of the trimethylantimony. This shows the electrical property can be adequately controlled. In this case, the Sb doped ZnTe/ZnS multiquantum well structure can obtain a high carrier concentration of $1 \times 10^{17}$ cm$^{-3}$.

Though the film thicknesses of the ZnTe layer 112a and ZnS layer 112b are respectively set to 1 nm, it is possible to change the film thicknesses within a range causing quantum effect and within a critical film thickness for coherent growth. In other words, the film thickness of the ZnTe layer and the film thickness of the ZnS can be freely set as long as they belong to a band gap between a band gap 550 nm of ZnTe and a band gap 340 nm of ZnS.

Also, though the first and the second embodiments of the present invention adopt an n-type ZnS substrate, other substrates such as an n-type ZnSe substrate or an n-type ZnSSe substrate can be utilized similarly as a substrate. These substrates can be easily obtained by the iodine transport method. Furthermore, if the n-type ZnS substrate 111 is substituted by an n-type ZnS layer formed on the ZnS substrate as a buffer layer, the similar effect would be obtained.

Substituting the ZnS crystal by the GaAs substrate which is easily obtained compared with the ZnS crystal, the structure shown in FIG. 1 can be formed on the GaAs substrate by using n-type ZnS, n-type ZnSe or n-type ZnSSe epitaxial layers formed by the MOCVD method.

THIRD EMBODIMENT

Next, a third embodiment of the present invention is explained referring to the drawings. The third embodiment is basically equal with the first embodiment explained with reference to FIG. 1. The third embodiment is different in that GaAs 31 is adopted as a substrate.

Figure 8:
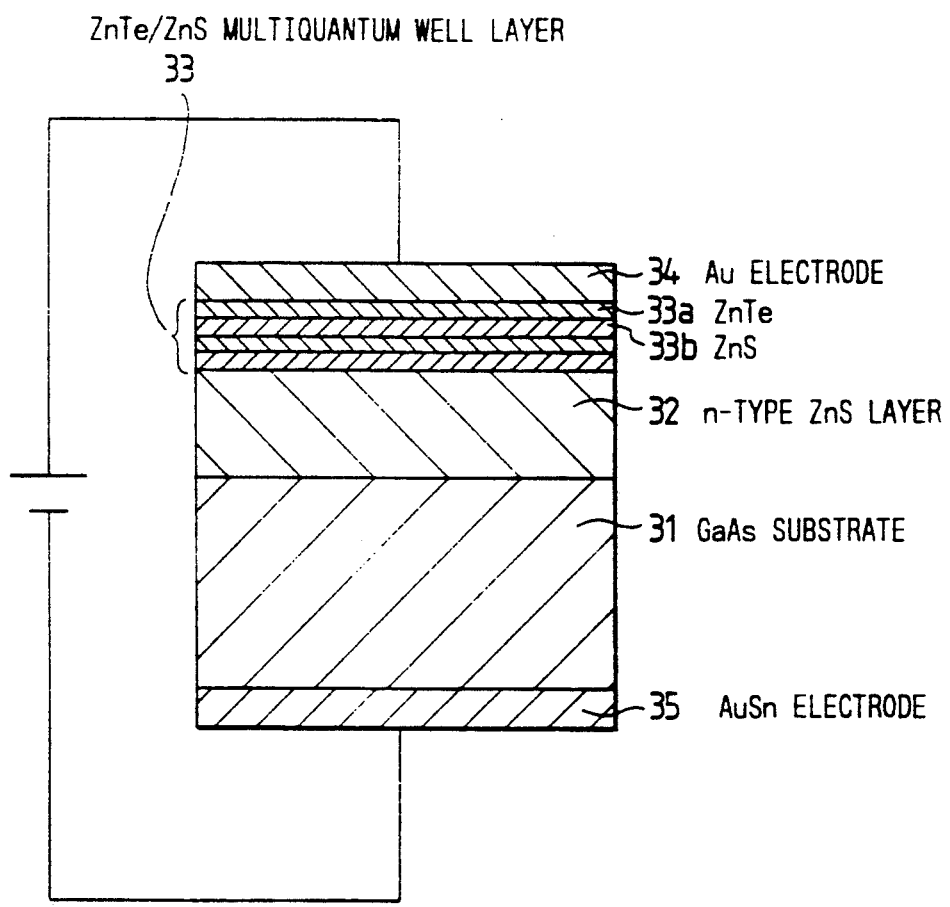
FIG. 8 is a cross-sectional view showing a structure of ZnS blue luminescence color LED in accordance with a third embodiment of the present invention.

In FIG. 8, a reference numeral 31 denotes an Si doped n-type GaAs substrate, and a reference numeral 32 denotes a Cl doped n-type ZnS layer. A reference numeral 33 denotes an Sb doped ZnTe/ZnS multiquantum well layer, and reference numerals 34 and 35 denote Au electrode and AuSn electrode, respectively.

The n-type ZnS layer 32 is formed on the GaAs substrate 31 as a buffer layer. Therefore, it is not necessary to use the ZnS substrate 111 shown in FIG. 1, since relatively easily obtained GaAs is used in this embodiment.

With this arrangement, if the Au electrode 34 is applied a positive bias voltage and the AuSn electrode 35 is applied a negative bias voltage, it is found that electrons are injected from the n-type ZnS layer 32 to the Sb doped ZnTe/ZnS multiquantum well layer 33.

As a result, these minority carriers are recombined with majority carriers in the Sb doped ZnTe/ZnS multiquantum well layer 33 so as to generate luminescence light.

In the voltage-current characteristics (not shown), it is found that voltage-current characteristics showed adequate rectification characteristics indicating a formation of p-n junction structure. In this case, a strong blue luminescence color having a wave length of approximately 450 nm, which corresponds to light emission occurring between quantum levels in the ZnTe/ZnS multiquantum well layer 33, was obtained at room temperature. Moreover, the external quantum efficiency was 1.2%.

FOURTH EMBODIMENT

Next, one example of a manufacturing method of the LED in accordance with a fourth embodiment of the present invention is explained with reference to FIG. 9.

Figure 9A:
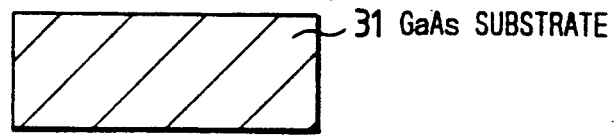
FIG. 9(a)-9(d) are cross-sectional view showing manufacturing steps of the ZnS blue luminescence color LED in accordance with a fourth embodiment of the present invention.
Figure 9B:
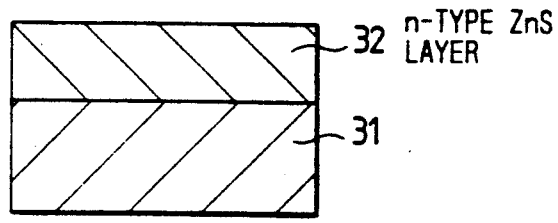

First of all, after oxide film on the GaAs substrate 31 is removed, a ZnS layer 32 is grown as shown in FIG. 9(b) at growth temperature of 350°~450° C. and growth pressure of 50 Torr by using dimethylzinc and hydrogen sulfide as material and 1-chlorooctane as dopant material in accordance with, for example, the MOCVD method.

Typical supply amounts of dimethylzinc, hydrogen sulfide, and 1-chlorooctane are respectively $4 \times 10^{-5}$ mol/min, $5 \sim 100 \times 10^{-6}$ mol/min, and $5 \sim 20 \times 10^{-7}$ mol/min, respectively.

With this arrangement, a Cl doped n-type ZnS having carrier concentration of $n \sim 1 \times 10^{18}$ cm$^{-3}$ is obtained. Furthermore, the n-type crystal can be obtained even if I, Al, Ga etc. are used as dopant.

Figure 9C:
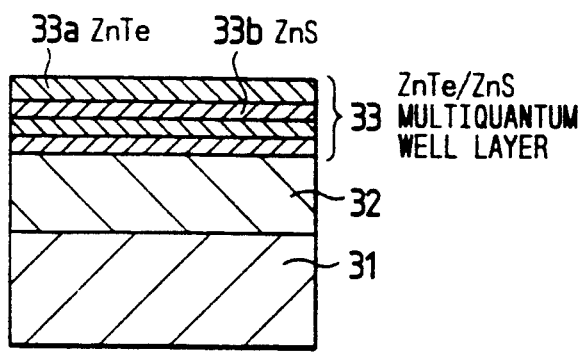

Subsequently, the ZnTe/ZnS multiquantum well structure 33 is formed on the ZnS layer 32 in compliance with the MOCVD, as shown in FIG. 9(c).

A ZnTe layer 33a constituting the ZnTe/ZnS multiquantum, well layer 33 is made from dimethylzinc and dimethyltellurium, and a ZnS layer 33b is made from dimethylzinc and hydrogen sulfide. The dopant Sb is made from trimethylantimony.

Typical supply amounts of dimethylzinc, dimethyltellurium, hydrogen sulfide, and trimethylantimony are respectively $4 \times 10^{-5}$ mol/min, $5 \sim 100 \times 10^{-6}$ mol/min, $6 \sim 40 \times 10^{-6}$ mol/min, and $6 \sim 30 \times 10^{-6}$ mol/min, respectively. Temperature of the substrate is set to 350°~450° C., and growth pressure is set to 50 Torr.

Figure 9D:
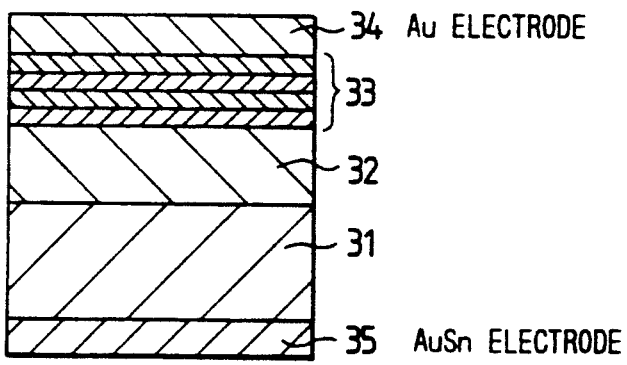

Next, as shown in FIG. 9(b), the ZnTe layer 33a is grown up to 1 nm by use of dimethylzinc, dimethyltellurium and, in turn, the ZnS layer 33b is grown up to 1 nm by use of dimethylzinc and hydrogen sulfide. Then, by alternately changing material gases, an alternating 100-cycle growth is obtained. After that, as shown in FIGS. 9(d), electrodes 34 and 35 are formed by metallic deposition of Au and AuSn.

Furthermore, in the case where the n-type GaAs substrate is adopted as described above, the n-type ZnS layer can be substituted by a ZnSSe epitaxial layer. In this case, the ZnSSe epitaxial layer can lattice-match to the GaAs substrate 31, thus improving quality.

Figure 15:
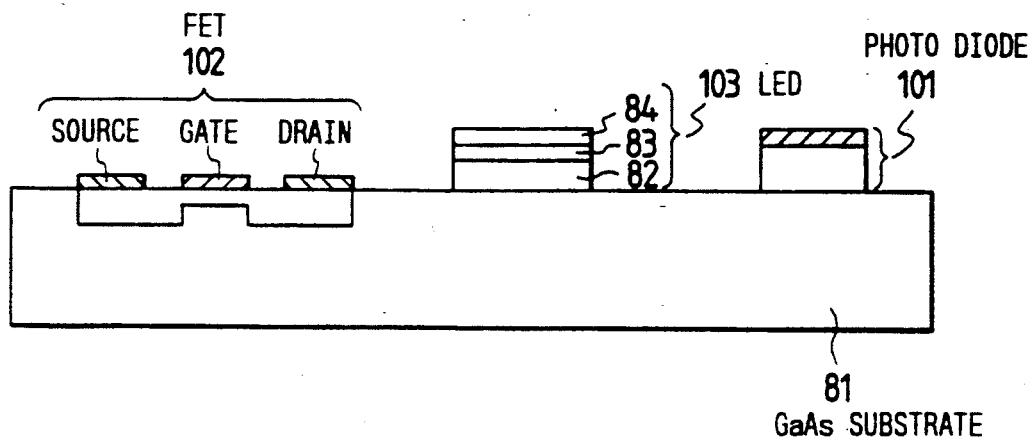
FIG. 15 is a cross-sectional view showing a structure of the integration device consisting of a blue luminescence color LED and a GaAs element in accordance with a tenth embodiment of the present invention.
Figure 16:
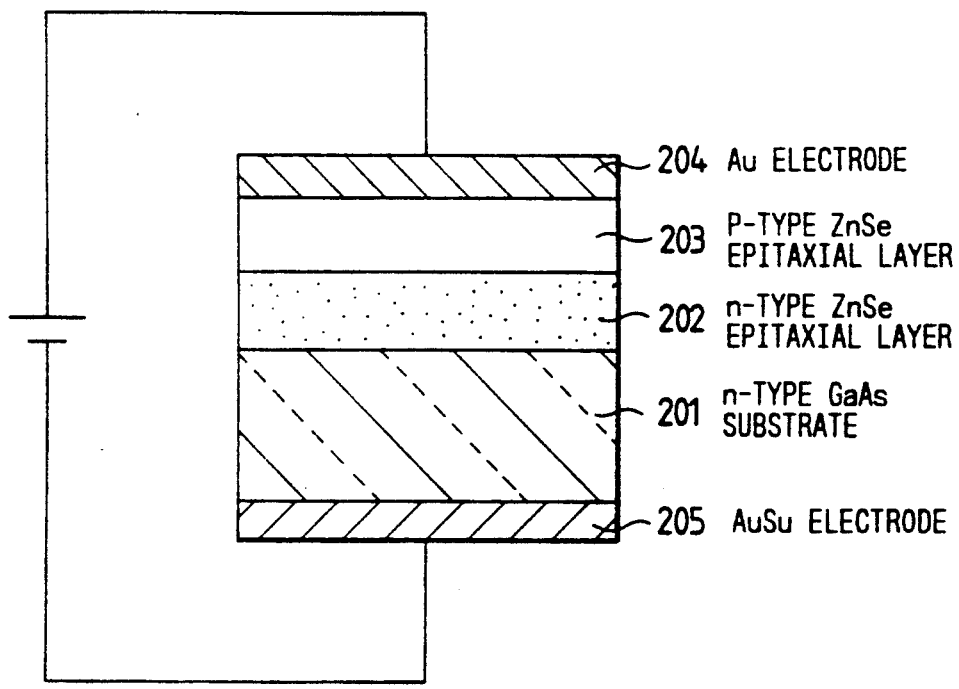
FIG. 16 is a cross-sectional view showing a structure of the conventional LED adopting ZnSe.
Figure 17:
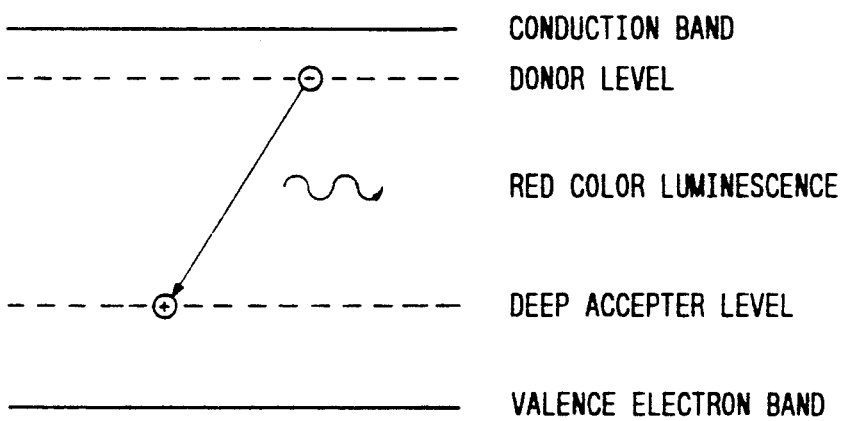
FIG. 17 is a view showing a band structure of ZnSe which emits a luminescence light through a deep level.

By the way, the present invention is practically utilized as shown in FIG. 15. That is, the GaAs having been formed with electronic devices or optical devices in advance is used as a substrate so that the blue luminescence color LED and its electronic/optical devices can be integrated as a unit.

Moreover, even if the p-type ZnTe layer constituting the multiquantum well layer in accordance with this embodiment of the present invention is substituted by the p-type ZnSTe mixed crystal, a similar effect can be obtained.

FIFTH EMBODIMENT

Figure 10A:
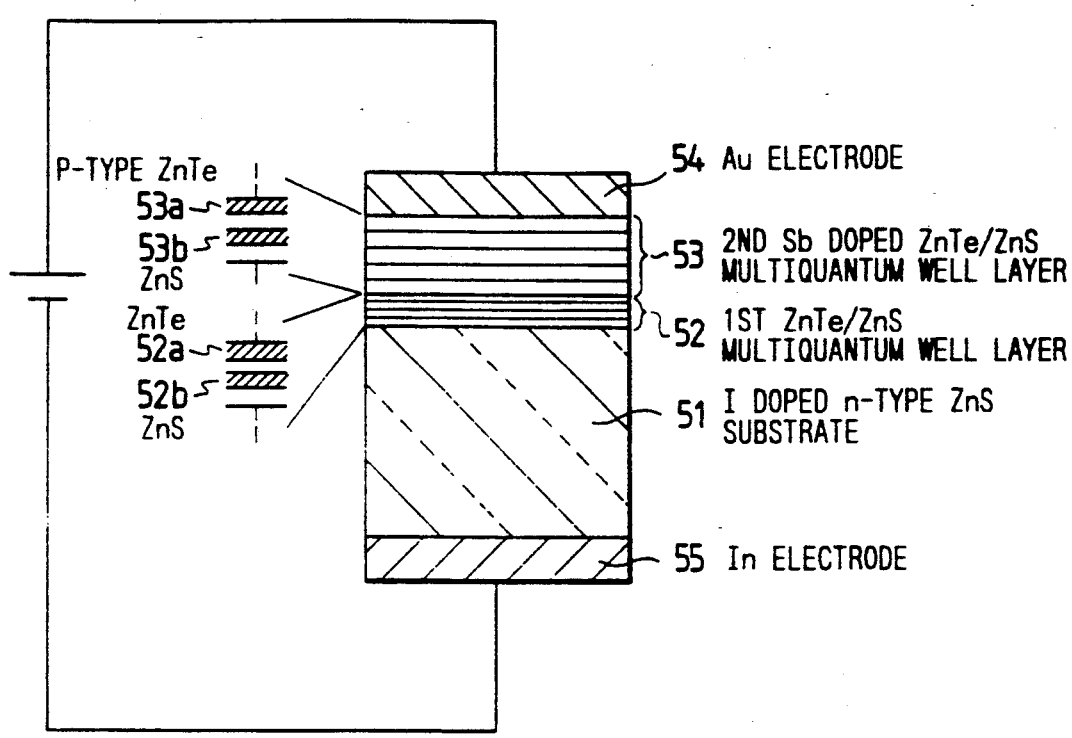
FIG. 10(a)-10(b) are cross-sectional views showing a structure of blue luminescence color LED in accordance with a fifth embodiment of the present invention, accompanying a band view.
Figure 10B:
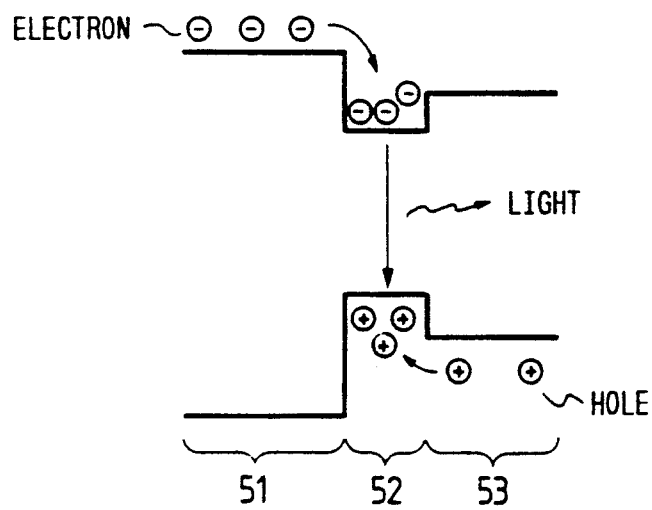

A fifth embodiment of the present invention is explained with reference to drawings. FIG. 10 is a cross-sectional view showing a structure of the ZnS blue luminescence color LED. A reference numeral 51 denotes an I doped n-type ZnS substrate, and a reference numeral 52 denotes a first ZnTe/ZnS multiquantum well layer. And, a reference numeral 53 denotes a second Sb doped ZnTe/ZnS multiquantum well layer.

The first ZnTe/ZnS multiquantum well layer 52 consists of the ZnTe layer 52a and ZnS layer 52b. Here, the ZnTe layer 52a is a non-doped ZnTe layer having a film thickness of 3 nm, and the ZnS layer 52b is a non-doped ZnS layer having a film thickness of 3 nm.

The second Sb doped ZnTe/ZnS multiquantum well layer 53 consists of the ZnTe layer 53a and ZnS layer 53b. Here, the ZnTe layer 53a is a p-type impurity doped ZnTe layer having a film thickness of 2 nm, and the ZnS layer 53b is a non-doped ZnS layer having a film thickness of 3 nm.

The structure of LED in accordance with this embodiment is a double hetero structure sandwiching the non-doped ZnTe/ZnS multiquantum well layer 52 between the p-type ZnTe/ZnS multiquantum well layer 53 and the n-type ZnS substrate 51.

The effective band gaps of the ZnTe/ZnS multiquantum well layer 52 and 53 are determined by quantum levels in the potential well formed by the hetero junction. A depth of this quantum level in the potential well is determined based on the film thicknesses of the well layer and the barrier layer. Therefore, the effective band gap can be varied within a range from approximately 550 nm (corresponding to the band gap of the ZnTe) to approximately 340 nm (corresponding to the band gap of the ZnS) calculated in terms of wavelength, by changing the film thickness of each layer of ZnTe and ZnS.

In this embodiment, effective absorption edges of the first multiquantum well layer 52 and the second multiquantum well layer 53 were 470 nm and 440 nm, respectively. The carrier concentrations of doped I and Sb were respectively $1 \times 10^{18}$ cm$^{-3}$. Reference numerals 54 and 55 denote the Au electrode and the In electrode, respectively.

By doping Sb into the ZnTe layer 53a constituting the second ZnTe/ZnS multiquantum well layer 53, the ZnTe layer 53a becomes a p-conduction type. Though the ZnS layer 53b is a non-doped ZnS layer, holes become majority carriers in the second ZnTe/ZnS multiquantum well layer 53.

The effective band gap of the first ZnTe/ZnS multiquantum well layer 52 is 470 nm, which is smaller than that (440 nm) of the second ZnTe/ZnS multiquantum well layer 53. Therefore, the ZnS substrate 51, the first ZnTe/ZnS multiquantum well layer 52, and the second ZnTe/ZnS multiquantum well layer 53 constitute a double hetero structure laminating three kinds of semiconductor layers each having different band gaps. The second ZnTe/ZnS multiquantum well layer 53 showed p-conduction type characteristics, and an obtained average hole carrier concentration was $4 \times 10^{17}$ cm$^{-3}$.

With this arrangement, if the Au electrode 54 is applied a positive bias voltage and the In electrode 55 is applied a negative bias voltage, it is found that holes are injected from the second Sb-doped ZnTe/ZnS multiquantum well layer 53 to the first ZnTe/ZnS multiquantum well layer 52. In the same manner, it is found that electrons are injected from the n-type ZnS substrate 51 to the first ZnTe/ZnS multiquantum well layer 52.

As a result, highly concentrated electrons and photons can be confined in the first ZnTe/ZnS multiquantum well layer 52 which is an active region.

In the voltage-current characteristics, it is found that voltage-current characteristics showed adequate rectification characteristics indicating a formation of p-n junction structure. In this case, a strong blue luminescence color having a wave length of approximately 470 nm was obtained at room temperature. Moreover, the external quantum efficiency was 5%.

SIXTH EMBODIMENT

Figure 11:
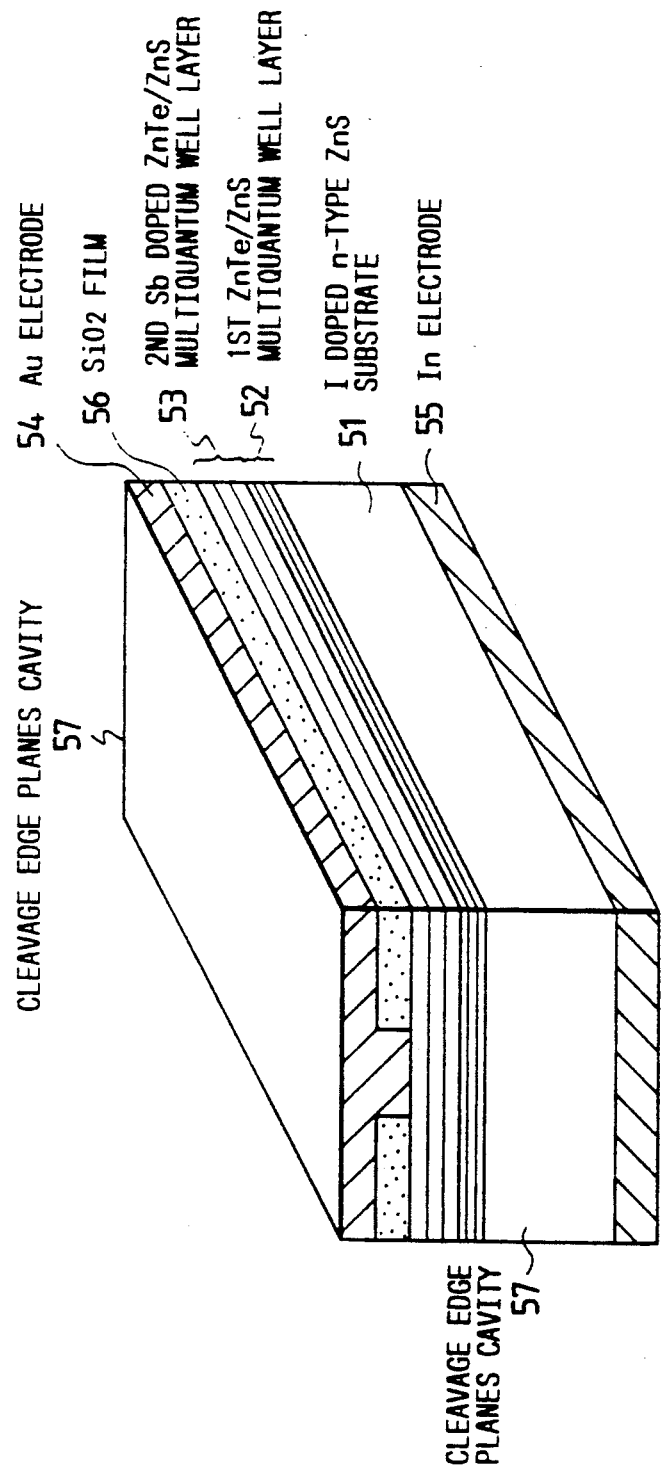
FIG. 11 is a view showing a structure of a blue luminescence color semiconductor laser in accordance with a sixth embodiment of the present invention.

The LED shown in FIG. 10 can be provided with a cavity, as shown in FIG. 11. In the drawing, An SiO$_2$ film 56 is provided on the second ZnTe/ZnS multiquantum well layer 53. The SiO$_2$ film 56 has a stripe-shaped groove.

With this arrangement, holes fed from the Au electrode 54; i.e. positive electrode, are effectively injected into the groove formed on the SiO$_2$ film 56.

Thus, it becomes possible to manufacture a semiconductor laser by forming the electrode stripe on the laminating structure as shown in FIG. 11 so as to form a cavity by cleavage edge planes.

SEVENTH EMBODIMENT

Next, one example of a manufacturing method of the semiconductor laser shown as the sixth embodiment is explained with reference to FIG. 12. This embodiment also adopts an iodine transport method as a growth method of the ZnS substrate 51.

After having been processed through three-hour deoxidation at temperature of 850° C. in highly purified hydrogen, the powder of ZnS is confined in a silica ampul etc.. with vacuum of $2 \times 10^{-6}$ Torr and sintered 50 hours at temperature of 1000° C. Thus sintered ZnS is used as the material. Furthermore, ZnS singal crystal being mirror lapped and having (111) surface applied with chemical etching is adopted as species crystal.

Iodine of 5 mg/cm2 concentration is confined in the growth ampul together with the sintered ZnS and the species crystal ZnS so as to allow the growth. In the growth ampul, temperature of the sintered ZnS is set to 850° C. and temperature of the ZnS species crystal is set to 840° C., so that temperature gradient is maintained. The growth was continued approximately 10 days.

Figure 12A:
FIG. 12(a)-12(d) are cross-sectional views showing manufacturing steps of the blue luminescence color LED in accordance with a seventh embodiment of the present invention.
Figure 12B:
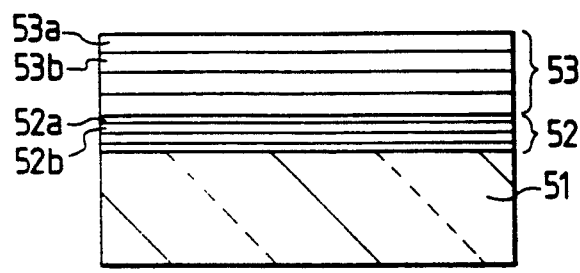

Next, the first ZnTe/ZnS multiquantum well layer 52 and the second ZnTe/ZnS multiquantum well layer 53 are formed on the ZnS crystal 51 shown in FIG. 12(a) in compliance with the MOCVD method, as shown in FIG. 12(b).

The ZnTe layers 52a, 53a constituting the ZnTe/ZnS multiquantum well layers 52, 53 are made from dimethylzinc and dimethyltellurium, and the ZnS layers 52b, 53b are made from dimethylzinc and hydrogen sulfide. The dopant Sb is made from trimethylantimony.

Typical supply amounts of dimethylzinc, dimethyltellurium, hydrogen sulfide, and trimethylantimony are respectively $4 \times 10^{-5}$ mol/min, $5 \sim 100 \times 10^{-6}$ mol/min, $6 \sim 40 \times 10^{-6}$ mol/min, and $6 \sim 30 \times 10^{-6}$ mol/min, respectively. Temperature of the substrate is set to 350°~450° C., and growth pressure is set to 50 Torr.

First of all, an oxide film on the surface of ZnS substrate 51 is removed by etchants of 50% NaOH aqueous solution. Next, as shown in FIG. 12(b), the ZnTe layer 52a is grown up to 3 nm by use of dimethylzinc, dimethyltellurium and, in turn, the ZnS layer 52b is grown up to 3 nm by use of dimethylzinc and hydrogen sulfide. Then, by alternately changing material gases, an alternating 50-cycle growth is obtained.

Subsequently, the Sb-doped ZnTe layer 53a is grown up to 2 nm by use of dimethylzinc, dimethyltellurium and trimethylantimony and, in turn, the ZnS layer 53b is grown up to 3 nm by use of dimethylzinc and hydrogen sulfide. Then, by alternately changing material gases, an alternating 200-cycle growth is obtained.

Figure 12C:
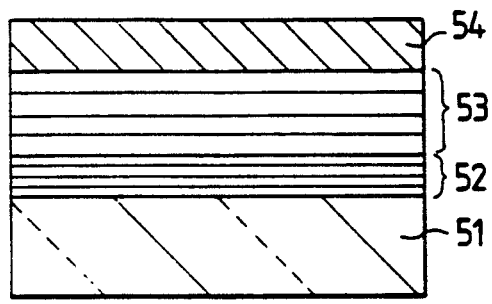
Figure 12D:
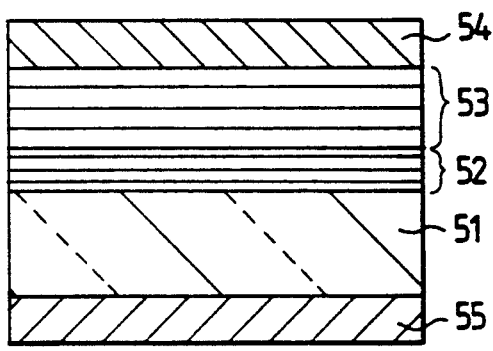

After that, as shown in FIGS. 12(c) and 12(d), electrodes 54 and 55 are formed by metallic deposition of Au and In.

Though the film thicknesses of the ZnTe layer 52a and ZnS layer 52b are respectively set to 3 nm, it is possible to change the film thicknesses within a range causing quantum effect and within a critical film thickness for coherent growth.

Also, though the fifth, the sixth and the seventh embodiments of the present invention adopt an n-type ZnS substrate, other substrates such as an n-type ZnSe substrate or an n-type ZnSSe substrate can be utilized similarly as a substrate. These substrates can be easily obtained by the iodine transport method. Furthermore, if the ZnS substrate 51 is substituted by an n-type ZnS layer formed on the ZnS substrate as a buffer layer, the similar effect would be obtained.

Substituting the ZnS crystal by a GaAs substrate which is easily obtained compared with the ZnS crystal, the structure shown in FIG. 1 can be formed on the GaAs substrate by using n-type ZnS, n-type ZnSe or n-type ZnSSe epitaxial layers formed by the MOCVD method.

Namely, though the LED shown in FIG. 1 is formed on the ZnS substrate 111, this ZnS substrate 111 can be substituted by the GaAs substrate which is easily obtained compared with the ZnS crystal. That is, even if the ZnS substrate 111 shown in FIG. 1 is substituted by the GaAs substrate, an LED in accordance with the present invention can be formed on the GaAs substrate as shown in FIG. 8, by letting ZnS crystal grow on the GaAs substrate.

EIGHTH EMBODIMENT

Figure 13:
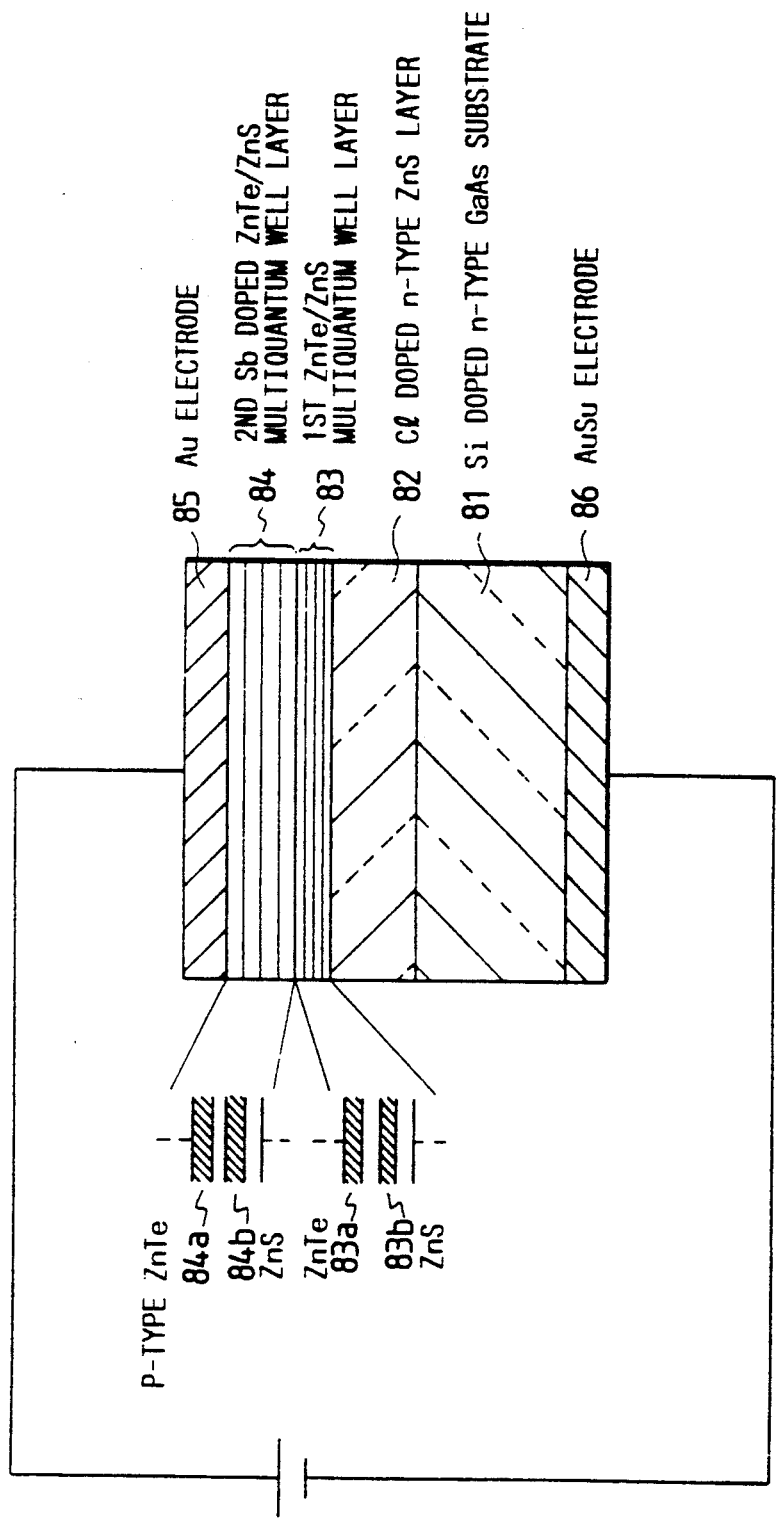
FIG. 13 is a cross-sectional view showing a structure of blue luminescence color LED in accordance with an eighth embodiment of the present invention.

Next, an eighth embodiment of the present invention is explained referring to the drawings. In FIG. 13, a reference numeral 81 denotes an Si doped n-type GaAs substrate, and a reference numeral 82 denotes a Cl doped n-type ZnS layer. A reference numeral 83 denotes a first ZnTe/ZnS multiquantum well layer, and a reference numeral 84 denotes a second Sb doped ZnTe/ZnS multiquantum well layer. And, reference numerals 85 and 86 denote Au electrode and AuSn electrode, respectively.

With this arrangement, if the Au electrode 85 is applied a positive bias voltage and the AuSn electrode 86 is applied a negative bias voltage, it is found that holes are injected from the second Sb doped ZnTe/ZnS multiquantum well layer 84 to the first ZnTe/ZnS multiquantum well layer 83. In the same manner, it is found that electrons are injected from the n-type ZnS layer 82 to the first ZnTe/ZnS multiquantum well layer 83.

As a result, highly concentrated electrons and photons can be confined in the first ZnTe/ZnS multiquantum well layer 83, which is an active region. In the voltage-current characteristics, it is found that voltage-current characteristics showed adequate rectification characteristics indicating a formation of p-n junction structure. In this case, a strong blue luminescence color having a wave length of approximately 470 nm was obtained at room temperature. Moreover, the external quantum efficiency was 1.2%.

NINTH EMBODIMENT

Next, one example of manufacturing method of the LED in accordance with a ninth embodiment of the present invention is explained with reference to FIG. 14.

Figure 14A:
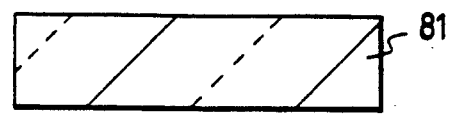
FIG. 14(a)-14(d) are cross-sectional views showing manufacturing steps of the blue luminescence color LED in accordance with a ninth embodiment of the present invention.
Figure 14B:
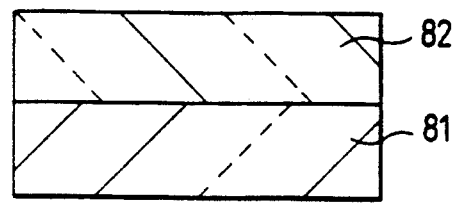

First of all, after an oxide film on the GaAs substrate 81 is removed, a ZnS layer 42 is grown as shown in FIG. 14(b) at growth temperature of 350°~450° C. and growth pressure of 50 Torr by adopting dimethylzinc and hydrogen sulfide as material and 1-chlorooctane as dopant material in accordance with, for example, the MOCVD method.

Typical supply amounts of dimethylzinc, hydrogen sulfide, and 1-chlorooctane are respectively $4 \times 10^{-5}$ mol/min, $5 \sim 100 \times 10^{-6}$ mol/min, and $5 \sim 20 \times 10^{-7}$ mol/min, respectively.

With this arrangement, a Cl doped n-type ZnS having carrier concentration of $n \sim 1 \times 10^{18}$ cm$^{-3}$ is obtained. Furthermore, the n-type crystal can be obtained even if I, Al, Ga etc. are used as dopant.

Figure 14C:
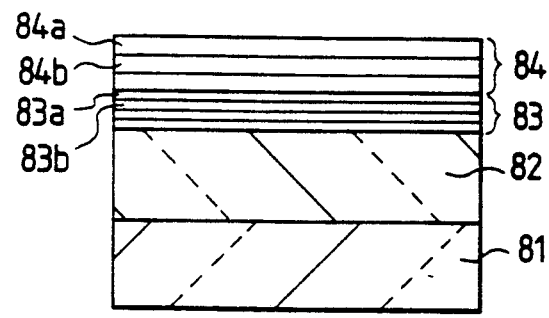

Subsequently, the ZnTe/ZnS multiquantum well structures 83 and 84 are formed on the ZnS layer 82 in compliance with the MOCVD, as shown in FIG. 14(c).

The ZnTe layers 83a and 84a constituting the ZnTe/ZnS multiquantum well layers 83 and 84 are made from dimethylzinc and dimethyltellurium, and the ZnS layers 83b and 84b are made from dimethylzinc and hydrogen sulfide. The dopant Sb is made from trimethylantimony.

Typical supply amounts of dimethylzinc, dimethyltellurium, hydrogen sulfide, and trimethylantimony are respectively $4 \times 10^{-5}$ mol/min, $5 \sim 100 \times 10^{-6}$ mol/min, $6 \sim 40 \times 10^{-6}$ mol/min, and $6 \sim 30 \times 10^{-6}$ mol.min, respectively. Temperature of the substrate is set to 350°~450° C., and growth pressure is set to 50 Torr.

Figure 14D:
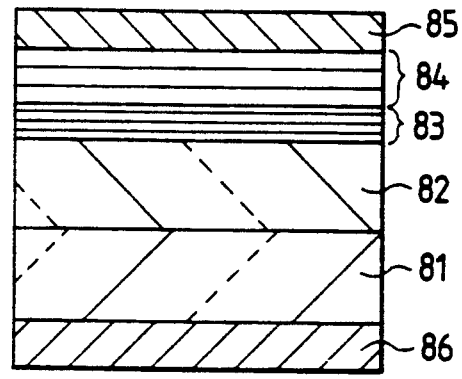

Next, the ZnTe layer 83a is grown up to 3 nm by use of dimethylzinc, dimethyltellurium and, in turn, the ZnS layer 83b is grown up to 3 nm by use of dimethylzinc and hydrogen sulfide. Then, by alternately changing material gases, an alternating 50-cycle growth is obtained. Subsequently, the Sb doped ZnTe layer 84a is grown up to 2 nm by use of dimethylzinc, dimethyltellurium and trimethylantimony and, in turn, the ZnS layer 84b is grown up to 3 nm by use of dimethylzinc and hydrogen sulfide. Then, by alternately changing material gases, an alternating 200-cycle growth is obtained. After that, as shown in FIG. 14(d), electrodes 85 and 86 are formed by metallic deposition of Au and AuSn.

Furthermore, in the case where the n-type GaAs substrate is adopted as described above, a ZnSSe epitaxial layer can be obtained as a crystal to be formed on the n-type GaAs. In this case, the ZnSSe epitaxial layer can lattice-match to the GaAs substrate, thus improving quality.

By the way, the present invention is practically utilized as shown in FIG. 15. That is, the GaAs having been formed with electronic devices or optical devices in advance is used as a substrate so that the blue luminescence color LED and its electronic/optical devices can be integrated as a unit.

Namely, as shown in FIG. 15, the LED 103 shown in FIG. 13, the photo diode 101 receiving light-emission from the LED 103, and the GaAs field effect transistor (GaAsFET) 102 are integrated on the GaAs substrate 81 so as to constitute an integrated circuit.

As is apparent from the foregoing description, in accordance with the present invention, it is possible to easily and reproducibly obtain a p-conduction type hole injection layer so as to realize highly concentrated carrier injection and obtain high efficiency in emitting blue luminescence light. Accordingly, it becomes possible to realize a blue luminescence color light-emitting device having high brightness and high efficiency such as a novel LED or a novel semiconductor laser. Thus, the present invention is extremely valuable in view of industrial aspect.

As this invention may be embodied in several forms without departing from the spirit of essential characteristics thereof, the present embodiments are therefore illustrative and not restrictive, since the scope of the invention is defined by the appending claims rather than by the description preceding them, and all changes that fall within meets and bounds of the claims, or equivalence of such meets and bounds are therefore intended to embraced by the claims.

What is claimed is:

1. A light-emitting device comprising: an n-conduction type ZnS crystal; a structure alternately laminating a member selected from the group consisting of a p-conduction type ZnTe layer and a p-conduction type ZnSTe layer, and a ZnS layer on said n-conduction type ZnS crystal; a positive electrode provided on said structure; and a negative electrode provided on said ZnS crystal.

2. A light-emitting device comprising: a GaAs substrate; an n-conduction type ZnS crystal provided on said GaAs substrate; a structure alternately laminating a member selected from the group consisting of a p-conduction type ZnTe layer and a p-conduction type ZnSTe layer, and a ZnS layer on said n-conduction type ZnS crystal; a positive electrode provided on said structure; and a negative electrode provided on said ZnS crystal.

3. A light-emitting device in accordance with claim 1 in which a member selected from the group consisting of an n-conduction type ZnSe crystal and an n-conduction type ZnSSe crystal, is used instead of said ZnS crystal.

4. A light-emitting device comprising: an n-conduction type ZnS crystal; a first structure alternately laminating a member selected from the group consisting of a ZnTe layer and ZnSTe layer, and a ZnS layer on said n-conduction type ZnS crystal; a second structure alternately laminating a member selected from the group consisting of a p-conduction type ZnTe layer and a p-conduction type ZnSTe layer, and a ZnS layer on said first structure; a positive electrode provided on said second structure; and a negative electrode provided on said ZnS crystal.

5. A light-emitting device comprising: a GaAs substrate; an n-conduction type ZnS crystal provided on said GaAs substrate; a first structure alternately laminating a member selected from the group consisting of a ZnTe layer and a ZnSTe layer and a ZnS layer on said n-conduction type ZnS crystal; a second structure alternately laminating a member selected from the group consisting of a p-conduction type ZnTe layer and a p-conduction type ZnSTe layer and a ZnS layer on said first structure; a positive electrode provided on said second structure; and a negative electrode provided on said ZnS crystal.

6. A light-emitting device in accordance with claim 4 or 5 in which a member selected from the group consisting of an n-conduction type ZnSe crystal and an n-conduction type ZnSSe crystal is used instead of said ZnS crystal.

7. A light-emitting device in accordance with claim 2 in which a member selected from the group consisting of an n-conduction type ZnSe crystal and an n-conduction type ZnSSe crystal, is used instead of said ZnS crystal.

8. A light-emitting device in accordance with claim 5 in which a member selected from the group consisting of an n-conduction type ZnSe crystal and an n-conduction type ZnSSe crystal, is used instead of said ZnS crystal.

* * * * *